United States Patent
Bright

(10) Patent No.: US 6,222,478 B1
(45) Date of Patent: Apr. 24, 2001

(54) PIPELINE ANALOG-TO-DIGITAL CONVERSION SYSTEM USING A MODIFIED CODING SCHEME AND METHOD OF OPERATION

(75) Inventor: William J. Bright, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/298,790

(22) Filed: Apr. 23, 1999

(51) Int. Cl.[7] ....................................... H03M 1/34
(52) U.S. Cl. ............................. 341/162; 341/155
(58) Field of Search ........................ 341/155, 144, 341/162, 161, 118, 156, 120

(56) References Cited

U.S. PATENT DOCUMENTS

| | | | |
|---|---|---|---|
| 4,903,026 | * | 2/1990 | Tiemann et al. .................... 341/155 |
| 5,534,864 | * | 7/1996 | Ono et al. .......................... 341/156 |
| 5,541,602 | * | 7/1996 | Opris et al. ........................ 341/155 |
| 5,635,937 | * | 6/1997 | Lim et al. .......................... 341/161 |
| 5,710,563 | * | 1/1998 | Vu et al. ............................ 341/155 |
| 5,874,912 | * | 2/1999 | Hasegawa ........................... 341/155 |

OTHER PUBLICATIONS

Stephen H. Lewis, et al., "A 10–b 20–Msample/s Analog–to–Digital Converter," IEEE Journal of Solid–State Circuits, vol. 27, No. 3, Mar., 1992, 8 pages.

Bret C. Rothenberg, et al., "A 20–Msample/s Switched–Capacitor Finite–Impulse–Response Filter Using a Transposed Structure," IEEE Journal of Solid–State Circuits, vol. 30, No. 12, Dec., 1995, 7 pages.

* cited by examiner

*Primary Examiner*—Peguy JeanPierre
*Assistant Examiner*—Jean Bruner Jeanglaude
(74) *Attorney, Agent, or Firm*—Dwight N. Holmbo; Wade James Brady, III; Frederick J. Telecky, Jr.

(57) ABSTRACT

A pipeline analog-to-digital conversion system (10) includes a plurality of cascaded subconverter stages (12) and a digital correction unit (16). Each subconverter stage (12) includes an n-bit analog-to-digital converter (26), an n-bit digital-to-analog converter (28), and an arithmetic unit (32). The n-bit analog-to-digital converter (26) generates a second intermediate digital signal (18) as a function of a first input analog signal (24) and a corresponding first intermediate digital signal (18) received from a previous stage (12).

22 Claims, 2 Drawing Sheets

PIPELINE ANALOG-TO-DIGITAL CONVERSION SYSTEM USING A MODIFIED CODING SCHEME AND METHOD OF OPERATION

TECHNICAL FIELD OF THE INVENTION

This invention relates in general to signal processing, and more particularly to a pipeline analog-to-digital conversion system using a modified coding scheme and method of operation.

BACKGROUND OF THE INVENTION

Many electronic systems manipulate both digital and analog signals. To perform their intended function, these systems may convert analog signals into digital signals. For example, digital signal processing technology facilitates the economical and accurate transmission of either analog or digital signals to a remote receiver. In a particular application, signals in digital communications systems are transmitted as a sequence of binary pulses with the advantage that corruption of the amplitudes of these pulses by noise is, to a large extent, of no consequence. In contrast, digital video disk systems transmit and receive analog signals. In order to operate, however, these systems require circuitry to interface signals from the analog domain to signals in the digital domain so that they may perform further digital signal processing. Specifically, these systems require analog-to-digital conversion systems to interface the analog and digital domains. Advances in digital video disk systems and other related technologies indicate a need for increased conversion rates in analog-to-digital conversion systems.

Traditional analog-to-digital conversion systems use flash architectures or pipeline architectures to obtain 8-bit resolution at approximately the same conversion rate as each other. For more than 8-bit resolution, however, flash architectures are no longer feasible alternatives because they require large die areas and power dissipation. Pipeline conversion architectures attempt to reduce die areas and power requirements while increasing the conversion rate for resolutions greater than 8-bit. A March, 1992 article in the IEEE Journal of Solid-State Circuits, authored by Lewis, et al. and entitled "A 10-b 20-Msample/s Analog-to-Digital Converter," describes a particular prior art pipeline conversion system. However, these prior art systems still do not realize the optimum conversion rates attainable for a pipeline conversion system with a particular range of die areas and power dissipation.

SUMMARY OF THE INVENTION

In accordance with the teachings of the present invention, a pipeline analog-to-digital conversion system is provided which substantially increases the efficiency of prior pipeline analog-to-digital conversion systems.

In accordance with one embodiment of the present invention, an analog-to-digital conversion system includes a plurality of cascaded subconverter stages wherein at least one of the plurality of subconverter stages includes an analog-to-digital converter that receives from a previous stage a first input analog signal and a corresponding first intermediate digital signal. The analog-to-digital converter generates a second intermediate digital signal in response to the first input analog signal and the first intermediate digital signal. A digital-to-analog converter coupled to the analog-to-digital converter converts the second intermediate digital signal into an intermediate analog signal. An arithmetic unit coupled to the digital-to-analog converter receives the intermediate analog signal and a second input analog signal and generates an output analog signal representative of the difference between the second input analog signal and the intermediate analog signal.

Another embodiment of the present invention is a method for converting an analog signal into a digital signal, wherein at least one of a plurality of cascaded subconverter stages receives from a previous stage a first input analog signal and a corresponding first intermediate digital signal, and establishes a plurality of voltage thresholds in response to the first intermediate digital signal. The method further includes generating a second intermediate digital signal in response to the first input analog signal and the voltage thresholds. The method concludes by converting the second intermediate digital signal into an intermediate analog signal and generating an output analog signal representative of the difference between a second input analog signal and the intermediate analog signal.

Technical advantages of the present invention include an analog-to-digital conversion system with a decreased throughput delay time for each individual subconverter stage and a decreased latency delay time for the entire system, resulting in an increased analog-to-digital conversion rate. The throughput delay time for each stage of a prior analog-to-digital conversion system includes the time required by the analog-to-digital converter to create an intermediate digital signal as a function of an input analog signal, and the time required by the digital-to-analog converter to create an intermediate analog signal as a function of the intermediate digital signal.

Unlike prior systems, each subconverter stage of the present invention generates an intermediate digital signal as a function of the intermediate digital signal and input analog signal of the previous stage. This allows the current subconverter stage to generate an intermediate analog signal while the previous stage generates an input analog signal. As a result, the delay times associated with generating an intermediate digital signal and an intermediate analog signal are substantially eliminated from the throughput delay time of each individual stage.

The throughput delay time for the present invention therefore comprises only the time required by the arithmetic unit to perform the arithmetic operation. As a result, the throughput delay time for each individual stage decreases in comparison to prior pipeline conversion systems. Since the latency delay time of the conversion system comprises the sum of all of the individual throughput delay times for each stage, the latency also decreases in comparison to prior pipeline conversion systems. Since the analog-to-digital conversion rate of the system bears an inverse relationship to the throughput delay time and the latency delay time, the analog-to-digital conversion rate for the system increases in comparison to prior systems.

BRIEF DESCRIPTION OF THE DRAWINGS

For a more complete understanding of the present invention and its advantages, reference is now made to the following description taken in conjunction with the accompanying figures in which like reference numbers indicate like features and wherein.

DETAILED DESCRIPTION OF INVENTION

Figure 1:
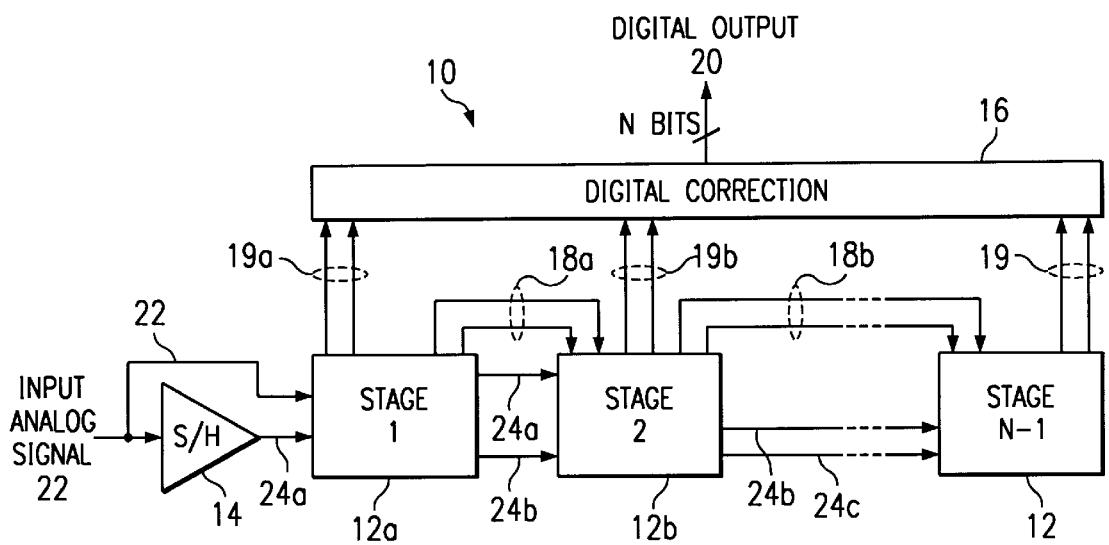
FIG. 1 illustrates one embodiment of an analog-to-digital conversion system in accordance with the teachings of the present invention.

FIG. 1 illustrates an analog-to-digital conversion system 10 that includes a plurality of cascaded subconverter stages 12, a sample and hold unit 14 coupled to the first subconverter stage 12, and a digital correction unit 16 coupled to each subconverter stage 12. In general, system 10 converts an input analog signal 22 into N bits of digital output 20. Digital output 20 may be presented in a variety of digital formats including, but not limited to, binary and hexadecimal formats.

In operation, sample and hold unit 14 and subconverter stage 12a simultaneously sample input signal 22. Sample and hold unit 14 communicates the held signal 22 to subconverter stage 12a as input analog signal 24a while subconverter stage 12a resolves n bits of the final N bit conversion to produce a digital signal 19a that is communicated to digital correction unit 16. Subconverter stage 12a communicates an output analog signal 24b representing the difference between signal 24a and the analog equivalent of signal 19a to subconverter stage 12b. In a particular embodiment, subconverter stage 12a resolves the most significant 1.5 bits of digital output 20.

Unlike prior pipeline conversion architectures, stage 12a also communicates an intermediate digital signal 18a and input analog signal 24a to subconverter stage 12b prior to communicating signal 24b. Signal 18a comprises an intermediate digital signal of stage 12a, and, in one embodiment, is identical to resolved digital signal 19a. Signal 24a represents the sample of signal 22 received by stage 12a. Forwarding signals 18a and 24a to subconverter stage 12b allows stage 12b to begin resolving the next n bits of the final N bit conversion prior to receiving signal 24b. As a result, the throughput delay time for stage 12b decreases while the conversion rate for system 10 increases. Stage 12a receives no intermediate digital signal, however, since sample and hold unit 14 performs a known multiply by one function on signal 22. It should be understood that although the reduction of throughout delay times is described with reference to stages 12a and 12b, each stage 12 may forward its associated signals 18 and 24 to the next stage 12 to reduce the throughput delay time of each succeeding stage 12.

Conversion at successive subconverter stages 12 continues until signal 24 reaches last subconverter stage 12 (stage N−1). Last subconverter stage 12 resolves the final bits of the N bit conversion and communicates the resolved digital signal 19 to digital correction unit 16. Digital correction unit 16 receives resolved digital signals 19 from each subconverter stage 12 and, in response, generates digital output 20 of N bits.

Figure 2:
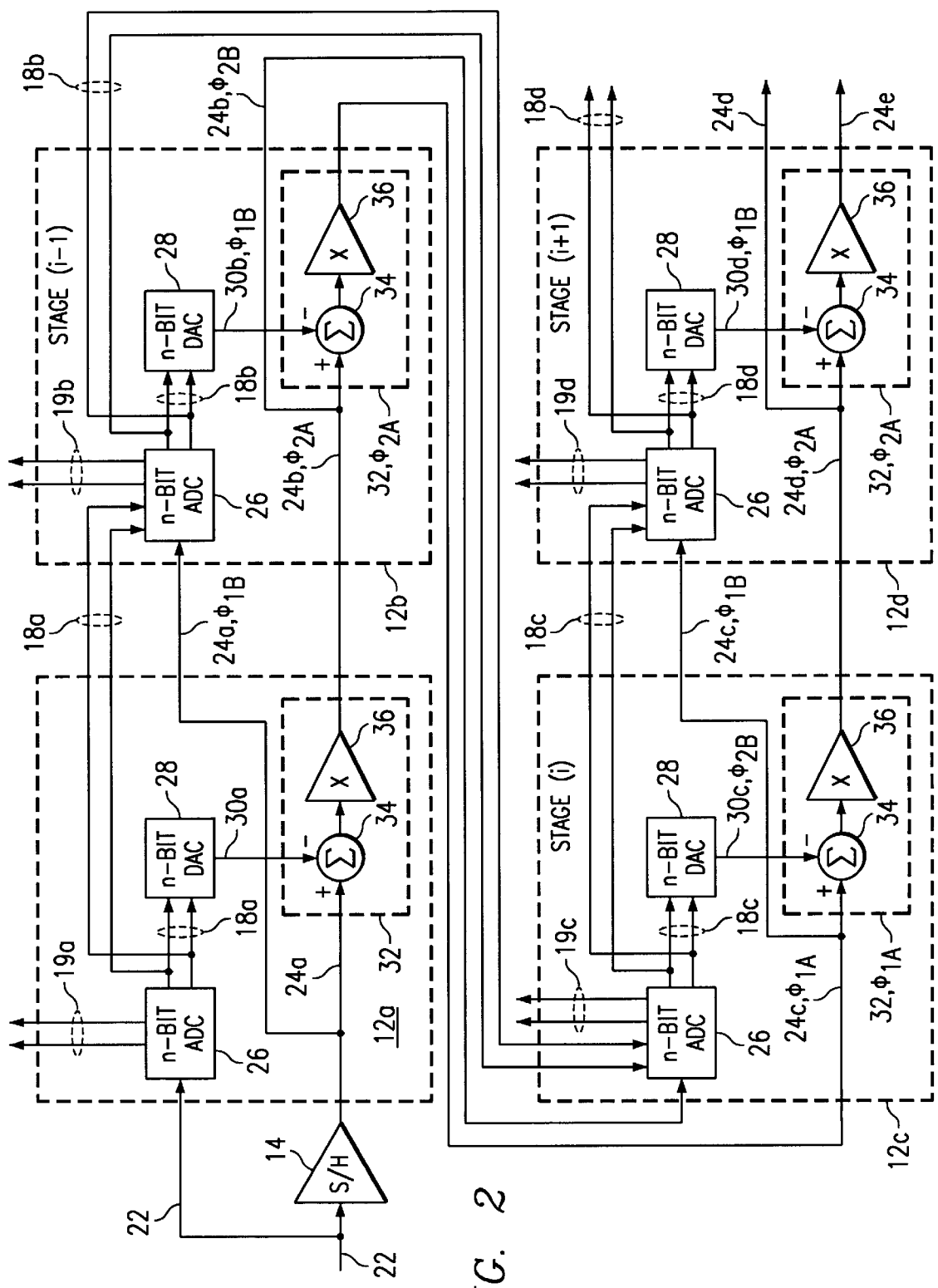
FIG. 2 illustrates one embodiment of a series of subconverter stages of the system.

FIG. 2 illustrates one embodiment of a series of subconverter stages 12 of system 10. Each stage 12 includes an n-bit analog-to-digital converter 26 ("ADC"), an n-bit digital-to-analog converter 28 ("DAC") coupled to converter 26, and an arithmetic circuit 32 coupled to converter 28. Each stage 12 other than the last stage (stage N−1) forwards its associated signals 18 and 24 to the next stage 12. Each stage 12 other than first stage 12a receives an intermediate digital signal 18 and an output analog signal 24 from a previous stage 12. Instead, ADC 26 of stage 12a receives signal 22 so that stage 12a may begin resolving n bits of the final N bit conversion prior to receiving signal 24a.

Although the following description of system 10 is made with reference to stages 12b and 12c, it should be understood that the following description applies to any stage 12 of system 10. Referring to stage 12c of FIG. 2, ADC 26 resolves n bits of the final N bit conversion and produces intermediate digital signal 18c for communication to DAC 28 and resolved digital signal 19c for communication to digital correction unit 16. Specifically, ADC 26 establishes voltage thresholds in response to signal 18b, communicated by stage 12b, and compares signal 24b, also communicated by stage 12b, to these voltage thresholds to generate signal 18c. ADC 26 then processes signal 18c through an output logic circuit to generate signal 19c suitable for processing by digital correction unit 16. Significantly, ADC 26 establishes voltage thresholds in response to signal 18b from stage 12b for comparison with signal 24b from stage 12b, not for comparison with signal 24c of stage 12c. DAC 28 converts signal 18c into a corresponding intermediate analog signal 30c.

Stage 12c generates signals 18c, 19c, and 30c while stage 12b generates signal 24c. When stage 12c receives signal 24c from stage 12b, signal 30c is available for processing by arithmetic unit 32. This allows stage 12c to resolve the next n bits of the final N-bit conversion without substantial delay. Stage 12c forwards signals 18c and 24c to stage 12d so that it begins resolving the next n bits of the final N-bit conversion while stage 12c generates signal 24d.

Arithmetic circuit 32 of stage 12c receives signal 24c and corresponding signal 30c at a summer 34 and amplifies the difference between them at an amplifier 36 to produce a corresponding output analog signal presented to stage 12d as signal 24d. For the case where each subconverter stage 12 resolves the most significant 1.5 bits of signal 24 to generate a binary digital output 20, amplifier 36 amplifies the difference between signals 24c and 30c by two. This ensures that the significance of the resolutions made in subsequent stages 12 decreases by a factor of two, which, in binary terms, results in one bit less significance for each succeeding stage 12. Similarly, amplifier 36 is adjusted to support the progressive conversion of signal 24 to digital output 20 in other digital formats, and at any desired level of resolution.

This process repeats for N−1 stages until system 10 converts the original input analog signal 24 into a corresponding digital output 20 of N bits. Forwarding signals 18b and 24b from stage 12b to ADC 26 of stage 12c decreases the throughput delay time of stage 12c by the amount of time required by ADC 26 of stage 12c to generate signal 18c, and by the time required by DAC 28 of stage 12c to generate signal 30c. As a result, the conversion rate of system 10 increases.

Figure 3:
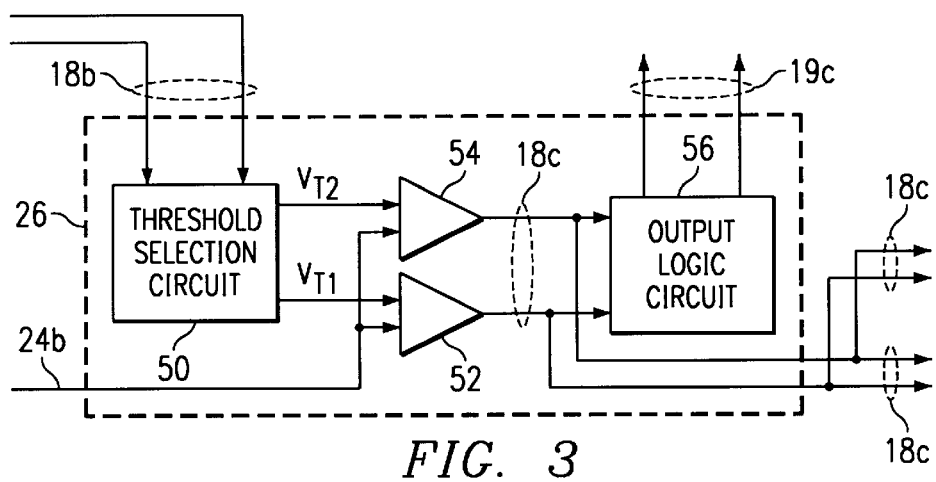
FIG. 3 illustrates one embodiment of an n-bit analog-to-digital converter of a subconverter stage.

FIG. 3 illustrates one embodiment of an ADC 26, such as, for example, ADC 26 of stage 12c, that includes a threshold selection circuit 50 coupled to a first threshold comparator 52 and a second threshold comparator 54. ADC 26 further includes an output logic circuit 56 coupled to comparators 52 and 54. Although the following description of resolving signal 24 is made with reference to stage 12c, it should be understood that the following description applies to any stage 12 of system 10 other than first stage 12a. In general, threshold selection circuit 50 of ADC 26 establishes voltage thresholds $V_{T1}$ and $V_{T2}$ in response to signal 18b from stage 12b and generates intermediate digital signal 18c for DAC 28 of stage 12c by comparing input analog signal 24b from stage 12b with $V_{T1}$ and $V_{T2}$. Output logic circuit 56 generates signal 19c suitable for processing by digital correction unit 16, in response to signal 18c. ADC 26 of stage 12c forwards signal 18c to ADC 26 of stage 12d so that stage 12d may similarly begin resolving the next n bits of the final N bit conversion. ADC 26 also forwards signal 18c to DAC 26 of stage 12c.

Threshold selection circuit 50 may comprise a resistor string, transistors, or any suitable combination of logic gates that receives signal 18b and, in response, establishes any suitable number of voltage thresholds required to resolve signal 24b to any desired level of resolution. Furthermore, ADC 26 may comprise any suitable number of comparators required to compare signal 24b with each established voltage threshold, $V_T$. In one embodiment, circuit 50 receives signal 18b that has three possible logic states, such as, for example, "00," "01," or "11," and, in response, establishes voltage thresholds $V_{T1}$ and $V_{T2}$ for comparison with signal 24b. It should be understood that the possible logic states of signal 18b may be any suitable combination of logic "1" and logic "0" based upon the selection of comparators 52 and 54. In order to understand the process of establishing thresholds $V_{T1}$ and $V_{T2}$, the conversion operation of stage 12c is examined.

In one embodiment, subconverter stage 12c samples input signal 24c, "VIN," generates intermediate digital signal 18c, "subADC," subtracts a corresponding intermediate analog signal 30c, "VDAC," from signal 24c, and multiplies the result by two to generate input analog signal 24d, "VOUT", for stage 12d. This process may be modeled for stage 12c by the following conversion equation:

$$VOUT_{(i)}=2(VIN_{(i)}-VDAC_{(i)})$$

where: VOUT=signal 24d;
VIN=signal 24c;
VDAC=signal 30c; and
i=current stage count.

By normalizing VIN to any value between a negative reference voltage, "–VREF," and a positive reference voltage, "+VREF," ADC 26 establishes voltage thresholds $V_{T1}$ and $V_{T2}$ as a function of "VREF," (e.g., $V_{T1}=-\frac{1}{4}VREF$ and $V_{T2}=+\frac{1}{4}VREF$). In one embodiment, each stage 12 of system 10 selects a common VREF corresponding to one-half of the peak-to-peak voltage of input analog signal 22. Consistent with the conversion equation, ADC 26 establishes these voltage thresholds for comparison with VIN. These voltage thresholds define three possible states for subADC, and three corresponding values for VDAC, in response to the value of VIN. For example:

| CASE | VIN | subADC | VDAC |
|---|---|---|---|
| 1 | –VREF < VIN < –¼VREF | 00 | –½VREF |
| 2 | –¼VREF < VIN < +¼VREF | 01 | 0 |
| 3 | +¼VREF < VIN < +VREF | 11 | +½VREF |

Because sample and hold unit 14 performs a multiply by one function on signal 22 to generate signal 24a, stage 12a establishes voltage thresholds $V_{T1}$ and $V_{T2}$ independent of input signal 24a. As a result, ADC 26 of stage 12a may use voltage thresholds $V_{T1}$ and $V_{T2}$ without modification to generate signals 18a and 19a. (E. g., $V_{T1}=-\frac{1}{4}VREF$ and $V_{T2}=+\frac{1}{4}VREF$). ADC 26 of stages 12 other than stage 12a modifies the voltage thresholds, $V_{T1}$ and $V_{T2}$, to generate signals 18 and 19. In order to modify thresholds $V_{T1}$ and $V_{T2}$ to generate signals 18c and 19c in response to signal 24b from stage 12b, circuit 50 of stage 12c models a modified conversion equation for stage 12b, $VOUT_{(i-1)}=2(VIN_{(i-1)}-VDAC_{(i-1)})$, according to each case above.

Case 1: If signal 18b from stage 12b="00," then $VDAC_{(i-1)}=-\frac{1}{2}VREF$. Replacing $VDAC_{(i-1)}$ with $-\frac{1}{2}VREF$ in the modified conversion equation yields $VOUT_{(i-1)}=2VIN_{(i-1)}+VREF$. This is equivalent to $\frac{1}{2}VOUT_{(i-1)}=VIN_{(i-1)}+\frac{1}{2}VREF$. Circuit 50 implements this division by two by dividing the previous voltage thresholds by two so that $V_{T1}=-\frac{1}{8}VREF$ and $V_{T2}=+\frac{1}{8}VREF$. Instead of adding $\frac{1}{2}VREF$ to $VIN_{(i-1)}$ and comparing $(VIN_{(i-1)}+\frac{1}{2}VREF)$ with $\pm\frac{1}{8}VREF$, circuit 50 subtracts $\frac{1}{2}VREF$ from thresholds $V_{T1}$ and $V_{T2}$ and compares $VIN_{(i-1)}$ with:

$V_{T1}=-\frac{1}{8}VREF-\frac{1}{2}VREF=-\frac{5}{8}VREF$ $V_{T2}=+\frac{1}{8}VREF-\frac{1}{2}VREF=-\frac{3}{8}VREF$ Case 2: If signal 18b from stage 12b is "01," then $VDAC_{(i-1)}=0$. Replacing $VDAC_{(i-1)}$ with "0" in the modified conversion equation yields $VOUT_{(i-1)}=2VIN_{(i-1)}$. This is equivalent to $\frac{1}{2}VOUT_{(i-1)}=VIN_{(i-1)}$. Circuit 50 implements this division by two by dividing the previous voltage thresholds by two so that $V_{T1}=-\frac{1}{8}VREF$ and $V_{T2}=+\frac{1}{8}VREF$. Therefore, circuit 50 compares $VIN_{(i-1)}$ with:

$V_{T1}=-\frac{1}{8}VREF$ $V_{T2}=+\frac{1}{8}VREF$

Case 3: If signal 18b from stage 12b="11," then $VDAC_{(i-1)}=+\frac{1}{2}VREF$. Replacing $VDAC_{(i-1)}$ with $+\frac{1}{2}VREF$ in the modified conversion equation yields $VOUT_{(i-1)}=2VIN_{(i-1)}-VREF$. This is equivalent to $\frac{1}{2}VOUT_{(i-1)}=VIN_{(i-1)}-\frac{1}{2}VREF$. Circuit 50 implements this division by two by dividing the previous voltage thresholds by two so that $V_{T1}=-\frac{1}{8}VREF$ and $V_{T2}=+\frac{1}{8}VREF$. Instead of subtracting $\frac{1}{2}VREF$ from $VIN_{(i-1)}$ and comparing $(VIN_{(i-1)}-\frac{1}{2}VREF)$ with $\pm\frac{1}{8}VREF$, circuit 50 adds $\frac{1}{2}VREF$ to thresholds $V_{T1}$ and $V_{T2}$ and compares $VIN_{(i-1)}$ with:

$V_{T1}=-\frac{1}{8}VREF+\frac{1}{2}VREF=\frac{3}{8}VREF$ $V_{T2}=+\frac{1}{8}VREF+\frac{1}{2}VREF=\frac{5}{8}VREF$ In all three cases, circuit 50 modifies thresholds $V_{T1}$ and $V_{T2}$ in response to signal 18b for comparison with signal 24b, $VIN_{(i-1)}$, not for comparison with signal 24c, $VIN_{(i)}$.

Comparators 52 and 54 may comprise a comparator transistor, such as, for example, a BJT, a MOSFET, or any other suitable comparator transistor. In general, comparators 52 and 54 receive thresholds $V_{T1}$ and $V_{T2}$, respectively, and compare them with signal 24b. In one embodiment, if signal 24b is greater than the respective threshold, then that comparator outputs a digital value of "1". Otherwise, it outputs a digital value of "0." As described above, comparators 52 and 54 may be selected to generate any suitable combinations of logic "1" and logic "0" for signal 18. Together, the digital values output by comparators 52 and 54 comprise intermediate digital signal 18c, "subADC$_{(i)}$," as follows:

| $VIN_{(i-1)}$ | subADC$_{(i)}$ |
|---|---|
| –VREF < $VIN_{(i-1)}$ < $V_{T1}$ | 00 |
| $V_{T1}$ < $VIN_{(i-1)}$ < $V_{T2}$ | 01 |
| $V_{T2}$ < $VIN_{(i-1)}$ < +VREF | 11 |

ADC 26 passes signal 18c to DAC 28 for further processing within stage 12c and to ADC 26 of stage 12d, as signal 18c, to begin resolving the next n bits of the final N bit conversion.

In one embodiment, ADC 26 includes output logic circuit 56 coupled to comparators 52 and 54. Circuit 56 may comprise any suitable configuration of logic gates that receives signal 18c and generates resolved digital signal 19c suitable for processing by digital correction unit 16 according to the following format:

| Signal 18c | Signal 19c |
|---|---|
| 00 | 00 |
| 01 | 01 |
| 11 | 10 |

In another embodiment, digital correction unit 16 receives signal 18c and itself performs any necessary conversion of signal 18c to form the N bit digital output 20.

Figure 4:
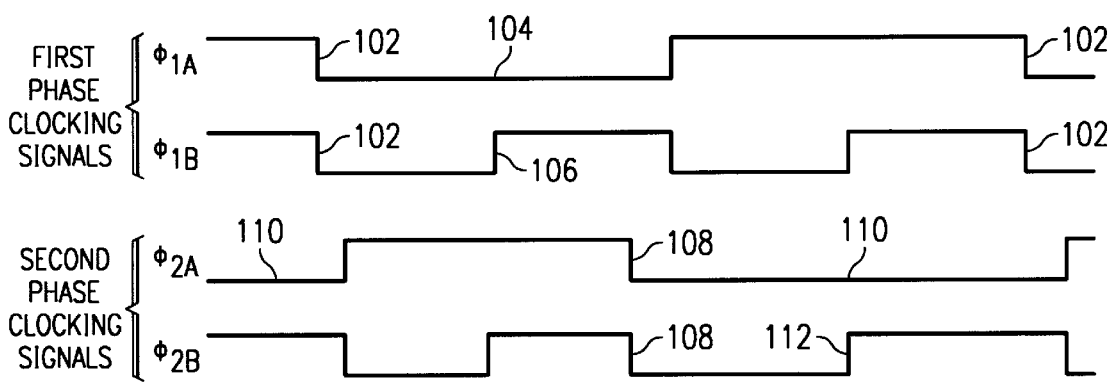
FIG. 4 illustrates a timing diagram for the operation of a subconverter stage of the system.

FIG. 4 illustrates a timing diagram 100 for the operation of each subconverter stage 12 of system 10, except first stage 12a, according to two clocking signals, $\phi_A$ and $\phi_B$. Different components of system 10 operate with respect to one of the two phases of each clocking signal. Generally, the first phase clocking signals include a signal $\phi_{1A}$ that controls the arithmetic operation performed by stage (i) of cascaded subconverter stages 12, and a signal $\phi_{1B}$ that controls sampling input analog signals 24 and establishing intermediate analog signals 30 by stages (i−1) and (i+1) of cascaded subconverter stages 12. The second phase clocking signals include a signal $\phi_{2A}$ that controls the arithmetic operation performed by stages (i−1) and (i+1) of cascaded subconverter stages 12, and a signal $\phi_{2B}$ that controls sampling input analog signal 24 and establishing intermediate analog signal 30 by stage (i) of cascaded subconverter stages 12.

Referring in particular to FIG. 2, where stage (i−1) is stage 12b, stage (i) is stage 12c, and stage (i+1) is stage 12d. Upon a falling edge 102 of $\phi_{1A}$ and $\phi_{1B}$, arithmetic circuit 32 of stage 12c samples signal 24c, and ADC 26 of stages 12b and 12d sample signals 24a and 24c, respectively. While $\phi_{1A}$ is low, as indicated at 104, arithmetic circuit 32 of stage 12c performs an arithmetic operation upon signals 24c and 30c, and provides signal 24d to stage 12d. Upon a rising edge 106 of $\phi_{1B}$, DAC 28 of stages 12b and 12d provide intermediate analog signals 30b and 30d, respectively. Upon a falling edge 108 of $\phi_{2A}$ and $\phi_{2B}$, arithmetic circuit 32 of stages 12b and 12d sample signals 24b and 24d, respectively, and ADC 26 of stage 12c samples signal 24b. While $\phi_{2A}$ is low, as indicated at 110, arithmetic circuit 32 of stages 12b and 12d performs an arithmetic operation upon signals 24b and 30b, and signals 24d and 30d, to provide signals 24c and 24e, respectively. Upon a rising edge 112 of $\phi_{2B}$, DAC 28 of stage 12c provides intermediate analog signal 30c.

In one embodiment of the present invention, falling edge 108 of $\phi_{2A}$ and $\phi_{2B}$ is accelerated so that arithmetic circuit 32 of stages 12b and 12d and ADC 26 of stage 12c may sample the appropriate signals. Falling edge 102 of $\phi_{1A}$ and $\phi_{1B}$ is accelerated so that arithmetic circuit 32 of stage 12c and ADC 26 of stages 12b and 12d may sample the appropriate signals. This sequencing allows system 10 to perform an accurate analog to digital conversion.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. An analog-to-digital conversion system comprising a plurality of cascaded subconverter stages, wherein at least one of the plurality of subconverter stages comprises:

an analog-to-digital converter operable to receive from a previous stage a first input analog signal and a corresponding first intermediate digital signal to determine a plurality of threshold voltages, the analog-to-digital converter further operable to generate a second intermediate digital signal in response to the first input analog signal and the first intermediate digital signal;

a digital-to-analog converter coupled to the analog-to-digital converter and operable to convert the second intermediate digital signal into an intermediate analog signal; and an arithmetic unit coupled to the digital-to-analog converter and operable to receive the intermediate analog signal and a second input analog signal, the arithmetic unit further operable to generate an output analog signal representative of the difference between the second input analog signal and the intermediate analog signal.

2. The system of claim 1, further comprising a sample and hold unit operable to sample and communicate the first input analog signal to a first subconverter stage.

3. The system of claim 1, further comprising a digital correction unit coupled to the analog-to-digital converter of each subconverter stage and operable to generate a digital output in response to the second intermediate digital signal of each subconverter stage.

4. The system of claim 1, wherein the second input analog signal comprises the output analog signal of the previous stage.

5. The system of claim 1, wherein:

the first input analog signal comprises the second input analog signal of the previous stage; and the first intermediate digital signal comprises the second intermediate digital signal of the previous stage.

6. The system of claim 1, wherein the analog-to-digital converter comprises:

a threshold selection circuit operable to generate a plurality of voltage thresholds in response to the first intermediate digital signal; and a comparator circuit operable to generate the second intermediate digital signal in response to the first input analog signal and the voltage thresholds.

7. The system of claim 6, wherein the comparator circuit further comprises:

a first voltage comparator; and a second voltage comparator.

8. The system of claim 6, wherein the analog-to-digital converter further comprises an output logic circuit operable to generate a resolved digital signal in response to the second intermediate digital signal.

9. The system of claim 1, wherein the analog-to-digital converter comprises:

a threshold selection circuit operable to select one of three voltage threshold pairs in response to the first intermediate digital signal of 1.5 bits; and a comparator circuit operable to generate the second intermediate digital signal in response to the first input analog signal and the voltage thresholds.

10. A method for converting an analog signal into a digital signal, wherein at least one of a plurality of cascaded subconverter stages performs the following steps:

(a) receiving from a previous stage a first input analog signal and a corresponding first intermediate digital signal;
(b) establishing a plurality of voltage thresholds in response to the first intermediate digital signal;
(c) generating a second intermediate digital signal in response to the first input analog signal and the voltage thresholds;
(d) converting the second intermediate digital signal into an intermediate analog signal; and
(e) generating an output analog signal representative of the difference between a second input analog signal and the intermediate analog signal.

11. The method of claim 10, further comprising:
sampling the first input analog signal at a first stage of a plurality of cascaded subconverter stages; and
communicating the first input analog signal to a subsequent subconverter stage prior to step (a).

12. The method of claim 10, wherein the step of establishing the voltage thresholds comprises:
calculating a reference voltage in response to the first intermediate digital signal; and
adjusting each voltage threshold in response to the reference voltage.

13. The method of claim 10, wherein the step of establishing the voltage thresholds comprises selecting one of three voltage threshold pairs in response to the first intermediate digital signal of 1.5 bits.

14. The method of claim 10, wherein the step of generating a second intermediate digital signal further comprises comparing the first input analog signal with each of the voltage thresholds.

15. The method of claim 10, further comprising the step of repeating the steps (a) through (d) at a plurality of cascaded subconverter stages to produce a digital output signal, wherein:
the output analog signal associated with a particular subconverter stage is communicated as the second input analog signal to the next subconverter stage;
the second intermediate digital signal associated with the particular subconverter stage is communicated as the first intermediate digital signal to the next subconverter stage prior to communicating the output analog signal;
the second input analog signal associated with the particular subconverter stage is communicated as the first input analog signal to the next subconverter stage prior to communicating the output analog signal; and
wherein a stage receives the first intermediate digital signal and the first input analog signal prior to receiving the second input analog signal.

16. An analog-to-digital conversion system comprising a plurality of cascaded subconverter stages, wherein at least one of the plurality of subconverter stage comprises:
an analog-to-digital converter comprising:
a threshold selection circuit operable to generate a plurality of voltage thresholds in response to a first intermediate digital signal received from a previous stage; and
a comparator circuit operable to generate a second intermediate digital signal in response to a first input analog signal received from a previous stage and the voltage thresholds;
a digital-to-analog converter coupled to the analog-to-digital converter and operable to convert the second intermediate digital signal into an intermediate analog signal; and
an arithmetic unit coupled to the digital-to-analog converter and operable to receive the intermediate analog signal and a second input analog signal, the arithmetic unit further operable to generate an output analog signal representative of the difference between the second input analog signal and the intermediate analog signal.

17. The system of claim 16, further comprising a sample and hold unit operable to sample and communicate the first input analog signal to a first subconverter stage.

18. The system of claim 16, further comprising a digital correction unit coupled to the analog-to-digital converter of each subconverter stage and operable to generate a digital output in response to the second intermediate digital signal of each subconverter stage.

19. The system of claim 16, wherein:
the second input analog signal comprises the output analog signal of the previous stage;
the first input analog signal comprises the second input analog signal of the previous stage, wherein each stage receives the first input analog signal prior to receiving the second input analog signal;
the first intermediate digital signal comprises the second intermediate digital signal of the previous stage, wherein each stage receives the first intermediate digital signal prior to receiving the second input analog signal.

20. The system of claim 16, wherein the comparator circuit further comprises:
a first voltage comparator; and
a second voltage comparator.

21. The system of claim 16, wherein the analog-to-digital converter further comprises an output logic circuit operable to generate a resolved digital signal in response to the second intermediate digital signal.

22. The system of claim 16, wherein the threshold selection circuit is further operable to select one of three voltage threshold pairs in response to the first intermediate digital signal of 1.5 bits.

* * * * *

UNITED STATES PATENT AND TRADEMARK OFFICE
CERTIFICATE OF CORRECTION

| | | |
|---|---|---|
| PATENT NO. | : 6,222,478 B1 | Page 1 of 1 |
| DATED | : April 24, 2001 | |
| INVENTOR(S) | : William J. Bright | |

It is certified that error appears in the above-identified patent and that said Letters Patent is hereby corrected as shown below:

<u>Title page,</u>
Under "Related U.S. Application Data," the following needs to be added:

-- [60] Provisional application No. 60/083,048, filed April 24, 1998 --.

Signed and Sealed this

Nineteenth Day of February, 2002

*Attest:*

*Attesting Officer*

JAMES E. ROGAN
*Director of the United States Patent and Trademark Office*